United States Patent
Parthasarathy et al.

(10) Patent No.: US 12,086,028 B2
(45) Date of Patent: Sep. 10, 2024

(54) REDUCTION OF ERRORS IN DATA RETRIEVED FROM A MEMORY DEVICE TO APPLY AN ERROR CORRECTION CODE OF A PREDETERMINED CODE RATE

(71) Applicant: Micron Technology, Inc., Boise, ID (US)

(72) Inventors: Sivagnanam Parthasarathy, Carlsbad, CA (US); Kishore Kumar Muchherla, Fremont, CA (US); Akira Goda, Tokyo (JP); Mustafa N. Kaynak, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/064,203

(22) Filed: Dec. 9, 2022

(65) Prior Publication Data

US 2023/0195570 A1    Jun. 22, 2023

Related U.S. Application Data

(63) Continuation of application No. 17/559,995, filed on Dec. 22, 2021, now Pat. No. 11,556,417.

(51) Int. Cl.
*G06F 11/10* (2006.01)
*H03M 13/11* (2006.01)

(52) U.S. Cl.
CPC ..... *G06F 11/1068* (2013.01); *H03M 13/1102* (2013.01)

(58) Field of Classification Search
None
See application file for complete search history.

(56) References Cited

U.S. PATENT DOCUMENTS

| 11,556,417 | B1 | 1/2023 | Parthasarathy et al. |
| 2004/0153902 | A1* | 8/2004 | Machado ............ G06F 11/1068 |
| | | | 714/E11.038 |

(Continued)

OTHER PUBLICATIONS

S.-H. Lim, J.-B. Lee, G.-M. Kim and W. H. Ahn, "A Stepwise Rate-Compatible LDPC and Parity Management in NAND Flash Memory-Based Storage Devices," in IEEE Access, vol. 8, pp. 162491-162506, 2020, doi: 10.1109/ACCESS.2020.3021498. (Year: 2020).*

(Continued)

*Primary Examiner* — Daniel F. McMahon
(74) *Attorney, Agent, or Firm* — Greenberg Traurig

(57) ABSTRACT

A memory device to use added known data as part of data written to memory cells with redundant data generated according to an error correction code (ECC). The code rate of the ECC may limit its capability to recover from excessive errors in the stored data. To reduce the errors, the added data retrieved from the memory cells can be corrected without using the ECC. Subsequently, remaining errors can be corrected via the ECC. Optionally, the added data can be configured to be the same as the data represented by an erased state of a subset of the memory cells such that when the subset is used to store the added data, the subset remains in the erased state to reduce wearing. Different subsets can be used to store added data for different write operations to distribute the benefit of reduced wearing.

19 Claims, 6 Drawing Sheets

(56) References Cited

U.S. PATENT DOCUMENTS

| | | | | |
|---|---|---|---|---|
| 2006/0059406 A1* | 3/2006 | Micheloni | ........... | G06F 11/1048 |
| | | | | 714/E11.049 |
| 2009/0249148 A1* | 10/2009 | Ito | ....................... | G06F 11/2215 |
| | | | | 714/E11.03 |
| 2011/0219266 A1* | 9/2011 | Rao | ........................ | G11C 29/02 |
| | | | | 714/25 |
| 2014/0059406 A1* | 2/2014 | Hyun | .................. | G11C 11/5642 |
| | | | | 714/773 |
| 2014/0122974 A1* | 5/2014 | Yun | ..................... | G06F 11/1048 |
| | | | | 714/773 |
| 2015/0089278 A1* | 3/2015 | Patapoutian | ........ | G06F 11/1048 |
| | | | | 714/6.12 |
| 2015/0331745 A1* | 11/2015 | Zastrow | .............. | G06F 11/1048 |
| | | | | 714/764 |
| 2022/0114049 A1* | 4/2022 | Nakai | .................... | G11C 29/52 |

OTHER PUBLICATIONS

Lim, Seung-Ho, et al., "A Stepwise Rate-Compatible LDPC and Parity management in NAND Flash Memory-Based Storage Devices." IEEE Access, 2020.

* cited by examiner

REDUCTION OF ERRORS IN DATA RETRIEVED FROM A MEMORY DEVICE TO APPLY AN ERROR CORRECTION CODE OF A PREDETERMINED CODE RATE

RELATED APPLICATIONS

The present application is a continuation application of U.S. patent application Ser. No. 17/559,995 filed Dec. 22, 2021, the entire disclosures of which application are hereby incorporated herein by reference.

TECHNICAL FIELD

At least some embodiments disclosed herein relate to memory systems in general, and more particularly, but not limited to memory systems configured with a predetermined rate of error correction code.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
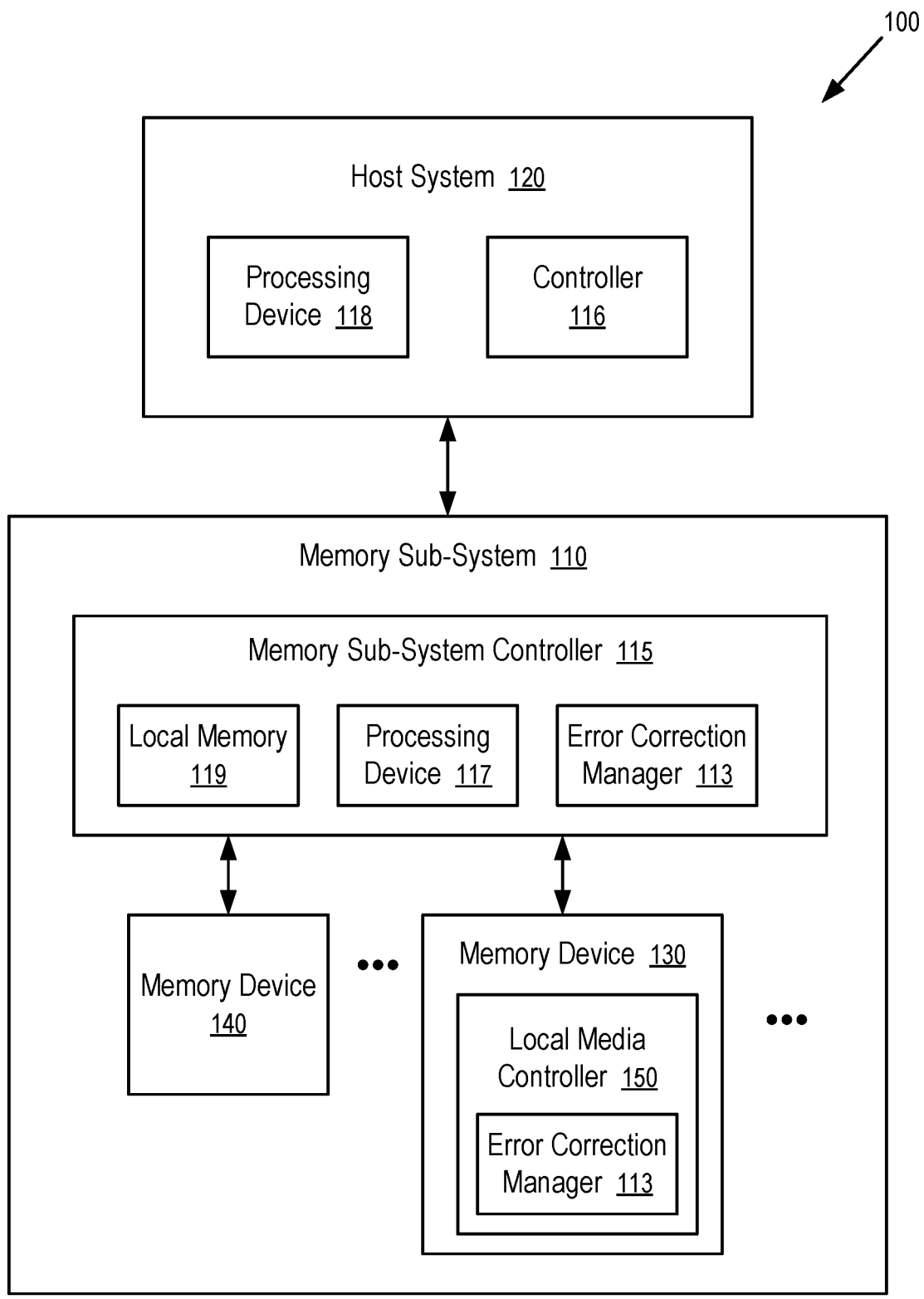
FIG. 1 illustrates an example computing system having a memory sub-system in accordance with some embodiments of the present disclosure.

At least some aspects of the present disclosure are directed to a memory sub-system configured to extend the useful life of a memory device and/or improve the reliability of data retrieval from the memory device that uses an error correction code having a predetermined rate. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A conventional memory device uses an error correction code (ECC) of a predetermined code rate to detect and correct random errors in data retrieved from the memory cells of the memory device. To detect and/or correct errors a data item is stored in the memory device together with redundant information according to the error correction code (ECC). The ratio between the size of the data item and the size of the total data stored for the data item (e.g., the data item and the redundant information) corresponds to the code rate of the error correction code (ECC). When there is a small number of random errors in the bits of the data item and/or the redundant information as retrieved from the memory cells, the errors can be detected and corrected using the technique of error correction code (ECC). In general, the amount of redundant information stored for the data item and thus the code rate control the error correction capability of the error correction code (ECC). When the bit error rate in the retrieved data increases, the probability of the error correction code (ECC) failing to decode and thus recover an error free version of the data item increases. When the bit error rate is increased to a level such that the probability of decoding failure reaches a threshold, the bit error rate can be considered to exceed the error correction capability of the error correction code (ECC).

The memory device ages through repeated cycles of programming the memory cells to store data and erasing the memory cells to allow the memory cells to be programmed again to store new data. As the memory device ages, the bit error rate in data retrieved from memory cells increases. When the bit error rate exceeds the error correction capability of the error correction code (ECC), which is controlled in general by its code rate, the use of the error correction code (ECC) may not be sufficient to correct the errors in the bits of data retrieved from the memory cells. Thus, an error-free version of the data item stored into the memory cell cannot be reliably recovered from the memory cells in a read operation. Therefore, after the memory cells in the memory device have been subjected to a number of program/erasure (PE) cycles, the bit error rate of data retrieved from memory cells can be considered to have reach or exceed the capability of the error correction code (ECC) of the predetermined code rate. As a result, the memory cells and/or the memory device may be considered to have reached the end of its useful life in reliably storing data.

At least some aspects of the present disclosure address the above and other deficiencies by combining user data and known data (or a known data pattern) to generate data to be protected via the error correction code (ECC) of a predetermined code rate to improve the success rate of the error correction code of a predetermined code rate in decoding the retrieved data. Although the use of the known data reduces the effective storage capacity for storing user data, the improved capability to correct errors in the user data allows the memory cells to reliably store users data, even after a bit error rate of data retrieved from the memory cells in general exceeds the capability of the error correction code (ECC) having the predetermined code rate. Thus, the useful life of the memory device in reliably storing data can be extended. When the techniques of the present disclosure are used, the memory cells and/or the memory device that would be otherwise considered to have reached the end of its useful life can continue to provide reliable storage services at a reduced storage capacity.

Further, the known data (or the known data pattern) can be configured to be represented by the erased states of a portion of memory cells used to store the data item. Thus, programming the memory cells to store the data item does not involving altering the states of the portion of memory cells. Therefore, wearing on the portion of the memory cells can be reduced. Different portions of memory cells can be selected for storing of the known data in different operations of data programming to level wearing among the memory cells. Thus, the useful life of the memory cells can be extended further.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

In general, a memory sub-system 110 can be a storage device, a memory module, or a hybrid of a storage device and memory module. Examples of a storage device include a solid-state drive (SSD), a flash drive, a universal serial bus (USB) flash drive, an embedded multi-media controller (eMMC) drive, a universal flash storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an internet of things (IoT) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

For example, the host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a fibre channel, a serial attached SCSI (SAS) interface, a double data rate (DDR) memory bus interface, a small computer system interface (SCSI), a dual in-line memory module (DIMM) interface (e.g., DIMM socket interface that supports double data rate (DDR)), an open NAND flash interface (ONFI), a double data rate (DDR) interface, a low power double data rate (LPDDR) interface, or any other interface. The physical host interface can be used to transmit data between the host system 120 and the memory sub-system 110. The host system 120 can further utilize an NVM express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from the memory sub-system 110 into information for the host system 120.

The controller 116 of the host system 120 can communicate with the controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), spin transfer torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with the memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 150) for media management within the same memory device package. An example of a managed memory device is a managed NAND (MNAND) device.

The controller 115 and/or a memory device 130 can include an error correction manager 113 configured to use known data or a known data pattern to improve error correction that is based on an error correction code (ECC) of a predetermined code rate. In some embodiments, the controller 115 in the memory sub-system 110 includes at least a portion of the error correction manager 113. In other embodiments, or in combination, the controller 116 and/or the processing device 118 in the host system 120 includes at least a portion of the error correction manager 113. For example, the controller 115, the controller 116, and/or the processing device 118 can include logic circuitry implementing the error correction manager 113. For example, the controller 115, or the processing device 118 (processor) of the host system 120, can be configured to execute instructions stored in memory for performing the operations of the error correction manager 113 described herein. In some embodiments, the error correction manager 113 is implemented in an integrated circuit chip disposed in the memory sub-system 110. In other embodiments, the error correction manager 113 can be part of firmware of the memory sub-system 110, an operating system of the host system 120, a device driver, or an application, or any combination therein.

For example, the error correction manager 113 implemented in the controller 115 can combine user data and known data (or a known data pattern) to generate data to be stored in a memory device that uses an error correction code (ECC) of a predetermined code rate. Since the data stored in the memory device includes known data (or the known data pattern), a portion of random bit errors in the data retrieved from the memory device is in the known data (or the know data pattern). Errors in such a portion can be corrected based on the knowledge about the known data (or the known data pattern). Correction of such errors reduces the effective error rate for the remaining errors in the data retrieved from the memory device. When the effective error rate for the remaining errors are less than the error correction capability of the error correction code (ECC) of the predetermined code rate, the error correction code (ECC) can detect and correct the remaining errors to recover an error free version of the user data. Thus, the use of the known data (or the known data pattern) effectively improves the error correction capability of the error correction code (ECC) in recovering the user data. From another point of view, introducing the known pattern, the ratio of ECC redundant data relative to user data is increased, which increases the error correct capability of the codeword beyond the predetermined capability in correcting data having no known pattern. As result, the memory device can tolerate more errors within the user data portion in comparison with storing data having no known pattern.

Since the known data (or the known data pattern) can be recovered without reading the memory cells, the data to be stored into the memory device can be configured in a way such that a subset of memory cells used to store the data remains at their erased state during the programming of the memory cells to store the data that is a combination of the user data and the known data (or the known data pattern). Thus, the cycle of programming the memory cells to store the data and then erasing the memory cells to allow storing of new data causes less wearing on the subset of memory cells than programming the subset of memory cells to other states and then erasing the subset of memory cells to return them to the erased state. Different program-erasure cycles can be configured to reduce wearing on different subsets of memory cells to extend the useful life of the memory cells.

Figure 2:
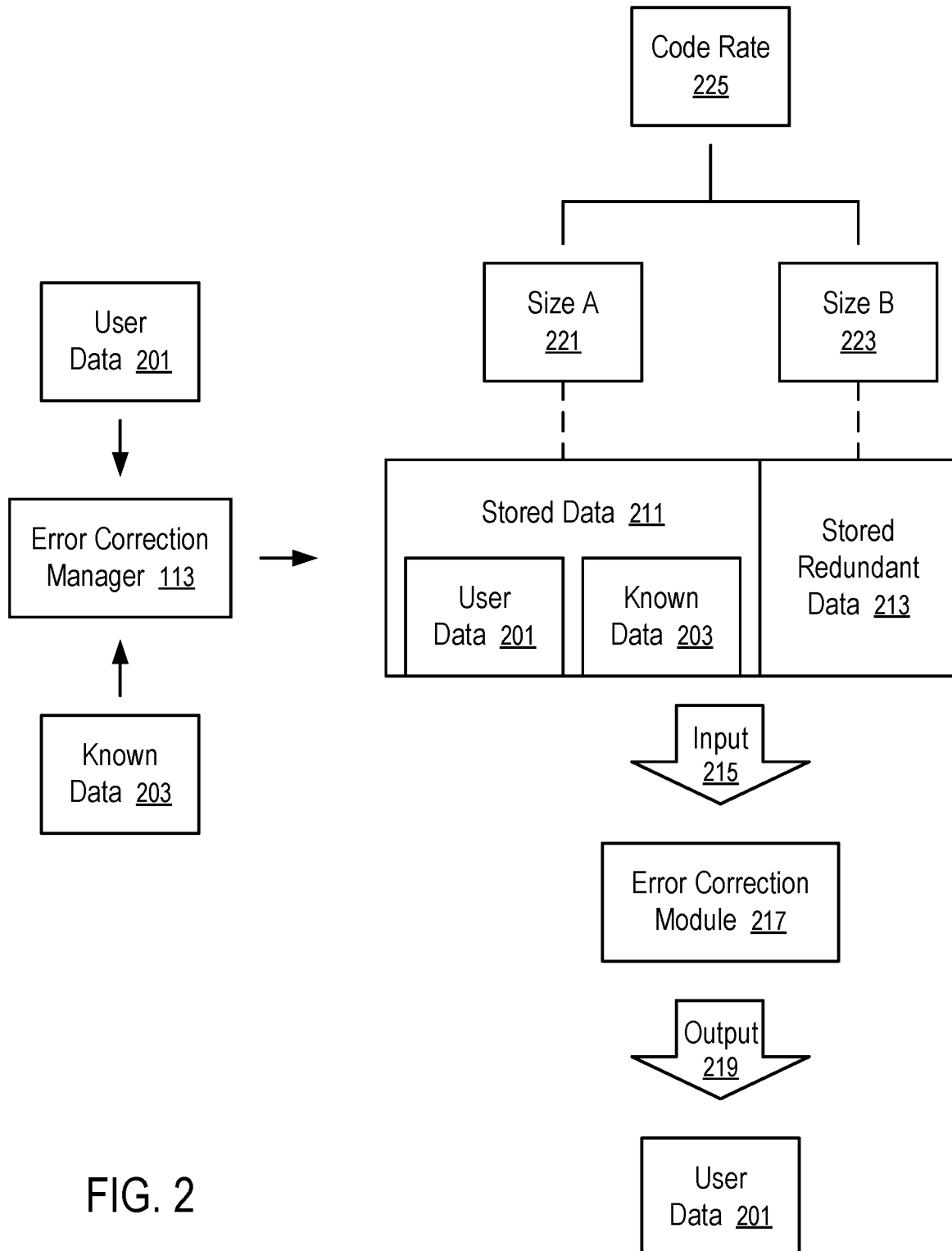
FIG. 2 shows a technique to improve capability of error correction for stored data using a memory device having a predetermined rate of error correction code according to one embodiment.

FIG. 2 shows a technique to improve capability of error correction for stored data using a memory device having a predetermined rate of error correction code according to one embodiment.

For example, the technique of FIG. 2 can be implemented in the memory sub-system 110 through the operations performed by the error correction manager 113.

In FIG. 2, an error correction module 217 is configured to operate using an error correction code (ECC) having a predefined code rate 225. The code rate 225 is the ratio between the size 221 of stored data 211 and the sum of the size 221 and the size 223 of stored redundant data 213.

For example, the stored redundant data 213 can include parity bits of selected subsets of bits in the stored data 211, such as in a low-density parity-check (LDPC) code.

For example, the set of data, including the stored data 211 and the stored redundant data 213, can be stored in a set of memory cells by programming the threshold voltages of the memory cells. Different combinations of threshold voltages of the memory cells represent different bit values in the set of data. To retrieve the set of data from the memory cells, the threshold voltages of the memory cells are checked to determine the bit values of the stored data 211 and the stored redundant data 213.

There can be random errors in the bits of the stored data 211 and the stored redundant data 213 in the checking of the threshold voltages of the memory cells. When the number of errors in the bits of the stored data 211 and the stored redundant data 213 is low, the error correction module 217 can detect and correct the errors.

In FIG. 2, known data 203 is used as part of the stored data 211 to reduce the bit error rate in the bits of the user data 201 and stored redundant data 213 to be corrected by the error correction code (ECC). For example, all of the bits in the known data 203 can be configured to have a predetermined value (e.g., one or zero). Alternatively, the bits in the known data 203 can be configured to have a predetermined value pattern. Thus, errors in the bits of the known data 203 can be corrected to generate an input 215 without relying upon the error correction module 217. Once the errors in the bits the known data 203 is corrected, the total number of bit errors in the input 215 to the error correction module 217 is reduced. Increased ECC to user ratio achieves larger error correction capability and can tolerate more read bit error rate (RBER). From another point of view, reducing the bit errors in the input 215 increases the success rate of the error correction module 217 in correcting all of the remaining errors to recover an error-free version of the user data 201 in the output 219 of the error correction module 217.

For example, the number of bits in the known data 203 can be configured to be the same as the sum of bits in the user data 201 and the stored redundant data 213. Since the bit errors are randomly distributed across the stored data 211 and the stored redundant data 213, one half of the bit errors is expected to be in the known data 203; and the other half of the bit errors is expected to be in the user data 201 and the stored redundant data 213. After correcting the bit errors in the known data 203, the bit error rate in the stored data 211 and the redundant data 213 is effectively reduced by half, which effectively increases the error correction capability of the error correction module 217 in recovering the user data 201 without error.

For example, without using the known data 203 as part of the stored data 211, the error correction module 217 can fail to reliably correct bit errors in the stored data 211 after the bit error rate reaches a threshold after a number of program/erasure cycles. However, at the loss of half of the user bits as an example, the emulated ECC to user byte is doubled up; and it improves the RBER correction capability of error correction module. For example, when the error correction manager 113 combines the user data 201 and known data 203 to generate the stored data 211, the error correction module 217 can reliably correct errors in the user data 201 when the bit error rate in the stored data 211 and the stored redundant data 213 is higher than the threshold but lower than twice the threshold. Thus, the user life of the set of memory cells can be extended beyond the number of program/erasure cycles until the bit error rate in the memory cells reaches twice the threshold.

In another example, the number of bits of the known data 203 is one third of the bits in the stored data 211 and the stored redundant data 213. Thus, correcting the errors in the known data 203 can remove the errors in the data bits determined from the states of the memory cells, increase ECC to user data ratio, and the error correction capability for the user data 201.

The technique of FIG. 2 can also be used to improve the reliability of recovering the user data 201. By reducing the bit error rate through correcting the bit errors in the known data 203, the likelihood of the error correction module 217 failing to correct the remaining errors in the user data 201 is reduced due to increased error correction capability for the user data resulting from an increased ratio between ECC data and user data. Thus, the use of the known data 203 as part of the stored data can be used to protect the user data 201 that needs extra protection for reliable recovery.

Figure 3:
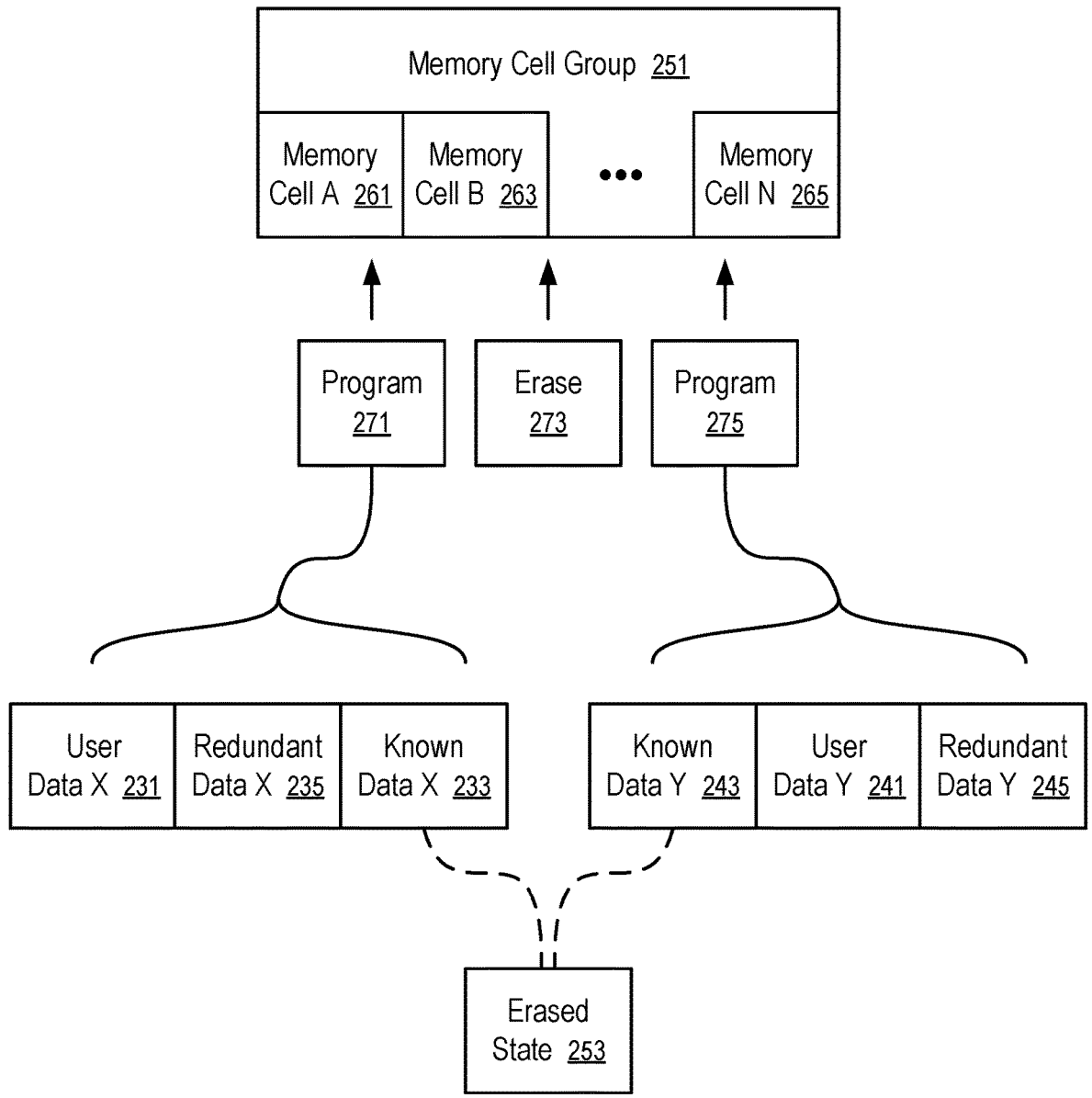
FIG. 3 shows a technique to reduce wearing on a group of memory cells configured to have data recovered via a predetermined rate of error correction code according to one embodiment.

FIG. 3 shows a technique to reduce wearing on a group of memory cells configured to have data recovered via a predetermined rate of error correction code according to one embodiment.

For example, the technique of FIG. 3 can be implemented in the memory sub-system 110 through the operations performed by the error correction manager 113.

For example, the technique of FIG. 3 can be used in combination with the technique of FIG. 2.

In FIG. 3, a memory cell group 251 is used to store a unit of data in memory cells 261, 263, . . . , 265.

Before programming a memory cell (e.g., 261) to store one or more bits of data, the memory cell (e.g., 261) is erased. For example, a voltage or a voltage pattern is applied to the memory cell (e.g., 261) to place the threshold voltage of the memory cell (e.g., 261) in a voltage region to represent an erased state of the memory cell (e.g., 261). To store one or more bits of data in the memory cell (e.g., 261), a voltage or a voltage pattern is applied to the memory cell (e.g., 261) to move the threshold voltage of the memory cell (e.g., 261) to a region that represents the one or more bits to be stored.

In FIG. 3, known data 233 is combined with user data 231 for storing in the memory cell group 251. For example, the known data 233 can be used to improve the error correction capability for recovering the user data 231 using an error correction module 217 that operates based on a predetermined code rate 225, as illustrated in FIG. 2.

The known data 233 can be selected such that a portion of memory cells (e.g., 265, . . . ) in the memory cell group 251 is to remain in the erased state 253 when the memory device (e.g., 130) programs 271 the memory cell group 251 to store the unit of data, including user data 231, known data 233, and redundant data 235. Thus, during the program-erasure cycle associated with the storing of the user data 231, the portion of memory cells (e.g., 265, . . . ) is substantially unaltered and remains in the erased state 253. As a result, wearing on the portion of memory cells used to store the known data 233 is reduced.

Different portions of the memory cell group 251 can be selected to store known data (e.g., 233, 243) combined with different user data (e.g., 231, 241) to level the wearing within the memory cell group 251.

For example, when the known data (e.g., 233 or 243) has half of the total bits to be stored in the memory cell group 251, the known data 233 combined with the user data 231 for storing in the memory cell group 251 can be selected such that the second half of the memory cells (e.g., 265, . . . ) remains in the erased state 253 when the memory device 130 programs the memory cell group 251 to store the user data 231, known data 233 and the redundant data 235. After the memory device 130 erases 273 the memory cell group 251, the memory device 130 can program 275 to store a different set of data that includes user data 241. The known data 243 used with the redundant data 245 can be configured such that the first half of the memory cells (e.g., 261, 263, . . . ) remains in the erased state 253 when the memory device 130 programs the memory cell group 251 to store the user data 231, known data 233 and the redundant data 235.

Similarly, if the known data has ⅓ of the total bits to be stored into the memory cell group 251, three operations to program the memory cell group to store different user data can use three differently configured known data segments that correspond to the erased state 253 in three different subsets of the memory cell group 251. Thus, the benefit of reduced wearing associated with the known data can be evenly distributed among the memory cells 261, 263, . . . , 265 in the group 251.

Figure 4:
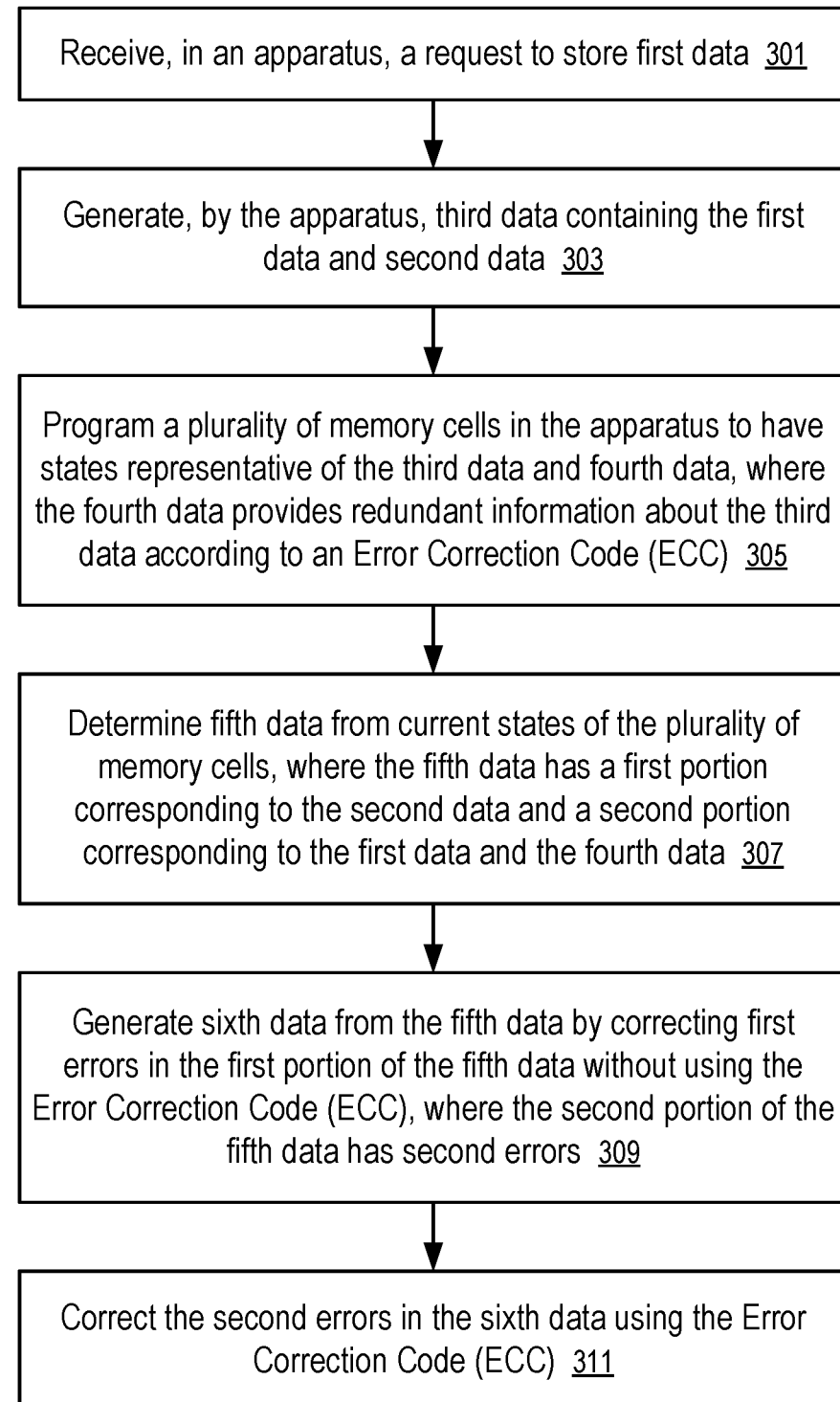
FIG. 4 shows a method to improve error correction according to one embodiment.

FIG. 4 shows a method to improve error correction according to one embodiment. The method of FIG. 4 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 4 is performed at least in part by the controller 115 and/or the local media controller 150 of the memory sub-system 110 in FIG. 1, and/or by the processing device 118 of the host system 120. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 4 can be implemented via operations performed by an error correction manager 113 using the technique of FIG. 2.

At block 301, an apparatus receives a request to store first data.

For example, the apparatus can be the memory sub-system 110 or a memory device 130. A write command to the apparatus can instruct the apparatus to store data including the first data.

In response to the write command, the apparatus can allocate a plurality of memory cells (e.g., 261, 263, . . . , 265) to store the first data (e.g., user data 201). An error correction module 217 of the apparatus is configured to detect and correct errors using an error correction code of a predetermined code rate (e.g., 225). In some instances, it is desirable to reduce the errors in data retrieved from the plurality of memory cells (e.g., 261, 263, . . . , 265) to increase the likelihood of success in error corrections performed by the error correction module 217.

At block 303, the apparatus generates third data containing the first data and second data.

For example, the first data is user data 201 to be stored in the plurality of memory cells (e.g., 261, 263, . . . , 265). The second data is added known data 203. The content of the added known data 203 is independent of the user data 201. The sum of the number of bits in the user data 201 and the number of bits in the known data 203 is equal to the number of in the stored data 211 that correspond to the third data.

At block 305, the apparatus programs the plurality of memory cells (e.g., 261, 263, . . . , 265) to have states representative of the third data and fourth data, where the fourth data provides redundant information about the third data according to an error correction code (ECC).

For example, the fourth data corresponds to the stored redundant data 213 for the stored data 211.

For example, the error correction code (ECC) is a low-density parity-check (LDPC) code; and the fourth data includes parity data generated from the third data according to the low-density parity-check (LDPC) code.

At block 307, in a read operation the apparatus determines fifth data from current states of the plurality of memory cells (e.g., 261, 263, . . . , 265), where the fifth data has a first portion corresponding to the second data and a second portion corresponding to the first data and the fourth data.

In general, data retrieved from the memory cells based on their current states can have random bit errors, resulting from shifting of the states from the time of the memory cells being programmed. Aging memory cells can have more errors.

At block 309, the apparatus generates sixth data from the fifth data by correcting first errors in the first portion of the fifth data without using the error correction code (ECC), where the second portion of the fifth data has second errors.

Correcting the first errors reduces the number of errors to be corrected in the sixth data and thus increases the likelihood of success of the operations of the error correction module 217.

At block 311, the apparatus corrects the second errors in the sixth data using the error correction code (ECC).

For example, the second data has a predetermined value or bit pattern. Thus, the apparatus can recreate the second data without relying upon reading the plurality of memory cells (e.g., 261, 263, . . . , 265). The recreated second data can be used to correct the errors in the corresponding portion in the fifth data.

For example, after the memory cells (e.g., 261, 263, . . . , 265) have been subjected to a number of program/erasure cycles, the bit error rate of data retrieved from the memory cells (e.g., 261, 263, . . . , 265) increases. The bit error rate can be sufficiently high such that error correction code (ECC) of the predetermined code rate 225 is insufficient to detect and correct all of the errors in the retrieved data, such as the fifth data. However, by correcting the second data without relying upon the error correction code (ECC), the bit error rate is reduced to allow the error correction code (ECC) to detect and correct remaining errors. From another point of view, the data ration between the ECC parity data and the user data in which the errors are to be corrected via ECC is increased. This increase boosts up the RBER correction capability.

Optionally, the technique of FIG. 3 can be used in combination with the technique of FIG. 2. For example, a subset of the plurality of memory cells (e.g., 261, 263, . . . , 265) can be selected store the second data. The second data can be identified to be the data represented by an erased state of the subset of the plurality of memory cells (e.g., 261, 263, . . . , 265). After an erasure operation, the subset is already in the erased state. Thus, programming the memory cells (e.g., 261, 263, . . . , 265) to store data, including storing the second data into the subset, has reduced impact on the state of the subset and thus causes reduce wearing.

Figure 5:
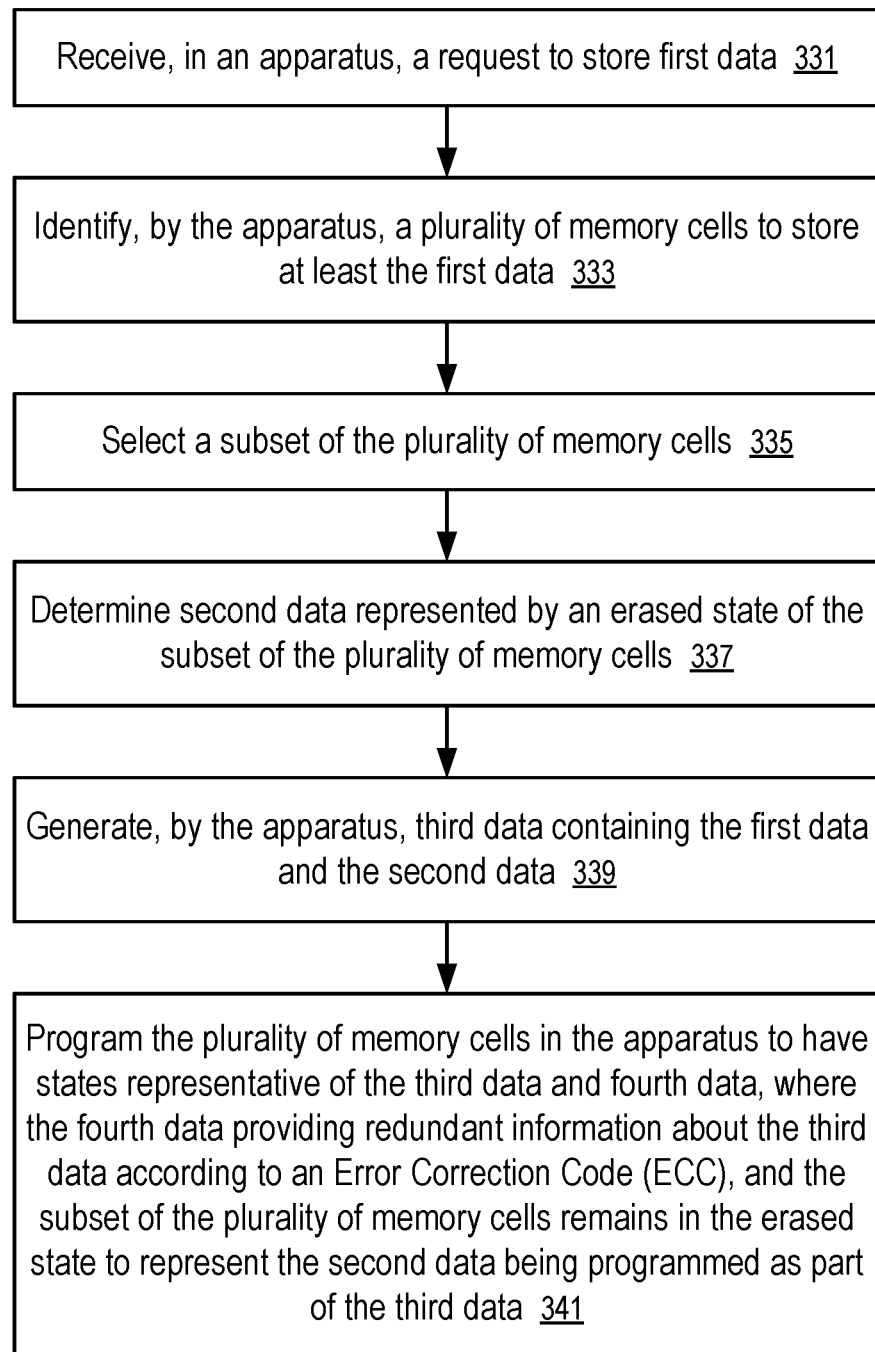
FIG. 5 shows a method to reduce wearing according to one embodiment.

FIG. 5 shows a method to reduce wearing according to one embodiment. The method of FIG. 5 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 5 is performed at least in part by the controller 115 and/or the local media controller 150 of the memory sub-system 110 in FIG. 1, and/or by the processing device 118 of the host system 120. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 5 can be implemented via operations performed by an error correction manager 113 using the technique of FIG. 3.

At block 331, an apparatus receives a request to store first data.

For example, similar to the method in FIG. 4, the apparatus can be the memory sub-system 110 or a memory device 130. A write command to the apparatus can instruct the apparatus to store data including the first data.

At block 333, the apparatus a plurality of memory cells (e.g., 261, 263, . . . , 265) to store at least the first data.

For example, in response to the write command, the apparatus can allocate a plurality of memory cells (e.g., 261, 263, . . . , 265) to store the first data (e.g., user data 201). An error correction module 217 of the apparatus is configured to detect and correct errors using an error correction code of a predetermined code rate (e.g., 225). In some instances, it is desirable to reduce the errors in data retrieved from the plurality of memory cells (e.g., 261, 263, . . . , 265) to increase the likelihood of success in error corrections performed by the error correction module 217.

At block 335, the apparatus selects a subset of the plurality of memory cells (e.g., 261, 263, . . . , 265).

At block 337, the apparatus determines second data represented by an erased state of the subset of the plurality of memory cells (e.g., 261, 263, . . . , 265).

At block 339, the apparatus generates third data containing the first data and the second data.

At block 341, the apparatus programs the plurality of memory cells (e.g., 261, 263, . . . , 265) to have states representative of the third data and fourth data, where the fourth data provides redundant information about the third data according to an error correction code (ECC), and the subset of the plurality of memory cells remains in the erased state to represent the second data being programmed as part of the third data.

For example, the error correction code (ECC) is a low-density parity-check (LDPC) code; and the fourth data comprises parity data generated from the third data according to the low-density parity-check (LDPC) code.

For example, the technique of FIG. 3 can be used in combination with the technique of FIG. 2. After determining fifth data from current states of the plurality of memory cells (e.g., 261, 263, . . . , 265), a first portion of the fifth data can be identified or determined from current state of the subset of the plurality of memory cells (e.g., 261, 263, . . . , 265). Since it is known that the subset of the plurality of memory cells (e.g., 261, 263, . . . , 265) is to remain at the erased state, the correct data for the first portion can be re-created without using the error correction code (ECC). After generating sixth data from the fifth data by replacing the first portion with data represented by the erased state of the subset of the plurality of memory cells (e.g., 261, 263, . . . , 265), the apparatus can use the error correction to correct remaining errors in the sixth data.

Different subsets can be used to host the added data represented by the erased state of memory cells in the subsets to distribute the benefit of reduced wearing of using the selected subsets to store the added data.

For example, the subset of the plurality of memory cells discussed above can be a first subset. After the programming of the memory cells 261, 263, . . . , 265 to store the first data, the apparatus may erase 273 the plurality of memory cells 261, 263, . . . , 265 to place the plurality of memory cells in the erased state in preparation of the memory cells 261, 263, . . . , 265 to store new data.

Subsequently, after receiving a request to store seventh data, the apparatus can: select a second subset of the plurality of memory cells, different from the first subset of the plurality of memory cells, determine eighth data represented by the erased state of the second subset of the plurality of memory cells; generate ninth data containing the seventh data and the eighth data; and program the plurality of memory cells 261, 263, . . . , 265 to have states representative of the ninth data and tenth data, where the tenth data provide redundant information about the ninth data according to the error correction code (ECC), while the second subset of the plurality of memory cells remains at the erased state to represent the eighth data being programmed as part of the ninth data.

A non-transitory computer storage medium can be used to store instructions of the firmware of a memory sub-system (e.g., 110). When the instructions are executed by the controller 115 and/or the processing device 117, the instructions cause the controller 115, the processing device 117, and/or a separate hardware module to perform the methods discussed above.

Figure 6:
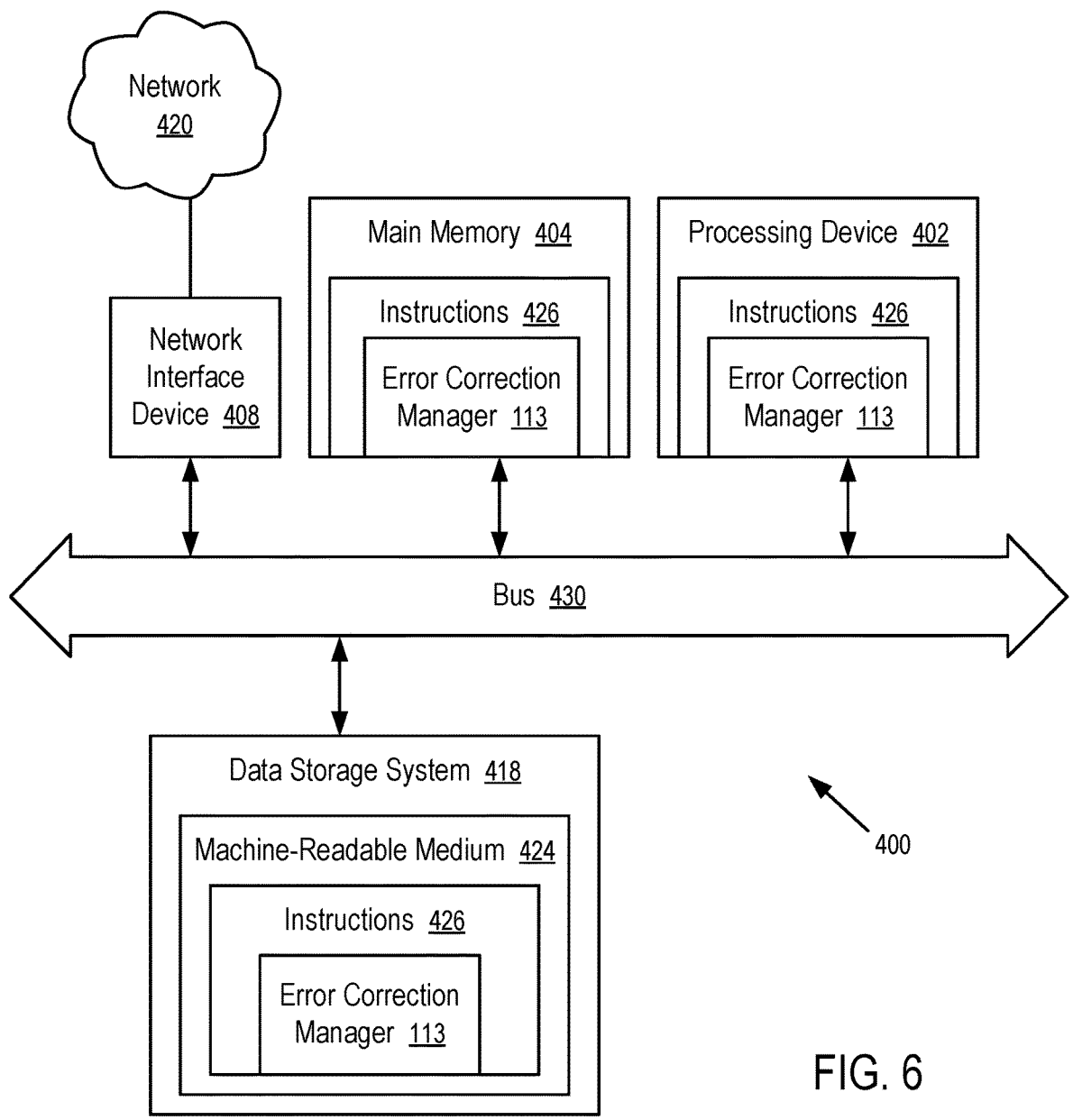
FIG. 6 is a block diagram of an example computer system in which embodiments of the present disclosure can operate.

FIG. 6 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of an error correction manager 113 (e.g., to execute instructions to perform operations corresponding to the error correction manager 113 described with reference to FIGS. 1-5). In alternative embodiments, the machine can be connected (e.g., networked) to other machines in a LAN, an intranet, an extranet, and/or the internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable medium 424, data storage system 418, and/or main memory 404 can correspond to the memory sub-system 110 of FIG. 1.

In one embodiment, the instructions 426 include instructions to implement functionality corresponding to an error correction manager 113 (e.g., the error correction manager 113 described with reference to FIGS. 1-5). While the machine-readable medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using application-specific integrated circuit (ASIC) or field-programmable gate array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:
   memory cells; and
   a logic circuit configured to:
   determine first data represented by states of the memory cells;
   generate second data from the first data through correction of one or more first errors in a first portion of the first data based on a known pattern of the first portion;
   generate third data from the second data through correction of one or more second errors in a second portion of the first data using an error correction code technique and redundant information contained in the second portion;
   receive input data to be written to the memory cells; and
   add supplemental data according to the known pattern to generate combined data including the input data and the supplemental data.

2. The device of claim 1, wherein the logic circuit is further configured to:
   generate, according to the error correction code technique, redundant data from the combined data; and
   program the memory cells to have states representative of the combined data and the redundant data.

3. The device of claim 2, wherein the supplemental data is independent of the input data.

4. The device of claim 2, wherein the supplemental data has a predetermined value or bit pattern.

5. The device of claim 2, wherein the error correction code technique is a low-density parity-check code technique; and the redundant data comprises parity data generated from the combined data.

6. The device of claim 5, wherein a number of bits in the combined data is a sum of a number of bits in the input data and a number of bits in the supplemental data.

7. The device of claim 2, wherein the supplemental data is configured to be representative of an erased state of a subset of the memory cells when the memory cells are programmed to have states representative of the combined data and the redundant data.

8. The device of claim 2, wherein the logic circuit is configured to generate the combined data to allow a subset of the memory cells to remain in an erased state after the memory cells are programmed to have states representative of the combined data and the redundant data.

9. The device of claim 8, wherein the logic circuit is further configured to level wearing within the memory cells by selecting different subsets of the memory cells to store supplemental data represented by the erased state in execution of different write commands to store input data into the memory cells.

10. A method, comprising:
    receiving, in a device having memory cells, a request to retrieve user data from the memory cells;
    determining, by the device, first data represented by states of the memory cells;
    generating second data from the first data through correction of one or more first errors in a first portion of the first data based on a known pattern of the first portion;
    generating third data from the second data through correction of one or more second errors in a second portion of the first data using an error correction code technique and redundant information contained in the second portion; and
    extracting the user data from the third data to provide a response to the request;
    wherein the first portion corresponds to supplemental data generated to store the user data into the memory cells; the supplemental data is independent of the user data.

11. The method of claim 10, wherein the second portion corresponds to the user data and redundant data generated using the error correction code technique from combined data, the combined data including the user data and the supplemental data.

12. The method of claim 11, wherein the supplemental data has a predetermined value or bit pattern; and the redundant data comprises parity data generated from the combined data using a low-density parity-check code technique.

13. The method of claim 11, wherein the supplemental data is representative of an erased state of a subset of the memory cells when the memory cells are programmed to have states representative of the combined data and the redundant data.

14. The method of claim 11, wherein the combined data is generated to allow a subset of the memory cells to remain in an erased state after the memory cells are programmed to have states representative of the combined data and the redundant data.

15. A method, comprising:
  receiving, in a device having memory cells, input data to be written to the memory cells;
  adding supplemental data according to a known pattern to generate combined data including the input data and the supplemental data;
  generating, according to an error correction code technique, redundant data from the combined data; and
  programming the memory cells to have states representative of the combined data and the redundant data;
  wherein the supplemental data is independent of the input data.

16. The method of claim 15, wherein the supplemental data has a predetermined value or bit pattern.

17. The method of claim 15, wherein the supplemental data is configured to be representative of an erased state of a subset of the memory cells when the memory cells are programmed to have states representative of the combined data and the redundant data.

18. The method of claim 15, wherein the combined data is generated to allow a subset of the memory cells to remain in an erased state after the memory cells are programmed to have states representative of the combined data and the redundant data.

19. The method of claim 18, further comprising:
  performing wear leveling within the memory cells by selecting different subsets of the memory cells to store supplemental data represented by the erased state in execution of different write commands to store input data into the memory cells.

* * * * *